US006955943B2

(12) United States Patent
Zakel et al.

(10) Patent No.: US 6,955,943 B2
(45) Date of Patent: Oct. 18, 2005

(54) METHOD FOR PRODUCING A SUBSTRATE ARRANGEMENT

(75) Inventors: Elke Zakel, Falkensee (DE); Ghassem Azdasht, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 15 days.

(21) Appl. No.: 10/362,862

(22) PCT Filed: Jun. 26, 2002

(86) PCT No.: PCT/DE02/02327

§ 371 (c)(1),
(2), (4) Date: May 8, 2003

(87) PCT Pub. No.: WO03/003444

PCT Pub. Date: Jan. 9, 2003

(65) Prior Publication Data

US 2003/0235976 A1 Dec. 25, 2003

(30) Foreign Application Priority Data

Jun. 26, 2001 (DE) ........................ 101 30 290

(51) Int. Cl.[7] .............................................. H01L 21/44
(52) U.S. Cl. ...................... 438/106; 438/118; 438/612; 438/615
(58) Field of Search ................................ 438/106, 118, 438/612–615

(56) References Cited

U.S. PATENT DOCUMENTS

| 5,861,323 A | | 1/1999 | Hayes |
| 5,895,229 A | * | 4/1999 | Carney et al. ............... 438/106 |
| 5,977,512 A | | 11/1999 | Azdasht et al. |
| 6,181,569 B1 | | 1/2001 | Chakravorty |

FOREIGN PATENT DOCUMENTS

| DE | 195 11 392 A1 | 10/1995 |
| DE | 197 54 372 | 9/1998 |
| DE | 197 54 372 A1 | 9/1998 |
| DE | 198 41 996 A1 | 3/2000 |
| DE | 195 44 929 C2 | 2/2001 |
| JP | 04151843 | 5/1992 |
| JP | 07153764 | 6/1995 |
| WO | WO 99/17594 | 4/1999 |

OTHER PUBLICATIONS

IBM Feb. 1991 Surface Activation of Dielectrics for Electroless Plating IBM Technical Disclosure Bulletin, vol. 33, No. 9.

IBM Jan. 1991 Laser Photochemical Ablation of Organic Photoconductor Belt Compositions to Remove Conductive and Dielectric Organic Layers IBM Technical Disclosure Bulletin, vol. 33, No. 8.

IBM Aug. 1988 Novel Laser Soldering Process for Flex Circuit Attachment IBM Technical Disclosure Bulletin, vol. 31, No. 3.

* cited by examiner

Primary Examiner—Ha Tran Nguyen
(74) Attorney, Agent, or Firm—McGlew and Tuttle, P.C.

(57) ABSTRACT

A method is provided for producing a substrate arrangement. The process includes the preparation of a substrate and bringing connecting surfaces of the substrate into contact with inner contacts of a wiring layer, the application of contact material to outer contacts of the wiring layer defining an outer connecting surface arrangement to form base contact bumps (31) and the application of joining material to the base contact bumps to form contact bump tops joined to the base contact bumps, wherein the joining material is applied as joining material moldings (35) and the contact bump tops are formed by at least partial melting of the joining material moldings by the action of laser energy.

16 Claims, 4 Drawing Sheets

METHOD FOR PRODUCING A SUBSTRATE ARRANGEMENT

FIELD OF THE INVENTION

The present invention relates to a method for producing a substrate arrangement with the process steps:
preparation of a substrate and bringing connecting surfaces of the substrate into contact with inner contacts of a wiring layer,
application of contact material to outer contacts of the wiring layer defining an outer connecting surface arrangement to form base contact bumps and
application of joining material to the base contact bumps to form contact bump tops joined to the base contact bumps.

Methods of the preceding type are used to produce substrate arrangements, for example, chip arrangements with a chip or a chip module as the substrate. Such chip arrangements are frequently also termed so-called "chip size packages". These chip arrangements firstly make it possible to redistribute the peripherally arranged connecting surfaces of a chip for a subsequent contacting with further components or substrates. Secondly, such chip arrangements should ensure a connection contact with high mechanical reliability because of its increased mechanical stability compared with the chip. Provided for this purpose are raised contact bumps each having a base contact bump constructed in column form and a contact bump top arranged thereon. As a result of the raised formation of the contact bumps, the stresses appearing in the contact region between a chip arrangement and a substrate in contact with it as a result of the different coefficients of thermal expansion of the chip and the substrate should be reduced as far as possible.

BACKGROUND OF THE INVENTION

A method of the type specified initially is known from DE 197 54 372 A1 wherein the raised contact bumps are formed by first producing the base contact bumps on the outer contacts of the wiring layer in a reflow method, then embedding the base contact bumps in a matrix material applied to the wiring layer and hardening the matrix material. Matrix material is then removed from the surface to expose or produce an arrangement of contact surfaces of the base contact bumps flush in the matrix material. Finally contact bump tops are formed by applying joining material to the plane contact surfaces of the base contact bumps and then melting the joining material in the reflow method.

In the method known from DE 197 54 372 A1 it is thus necessary to remove material from the surface between the formation of the base contact bumps and the formation of the contact bump tops on the base contact bumps in order to form the contact surfaces on the base contact bumps. In addition, regardless of the type of subsequent contacting of the chip arrangement with a substrate, because the contact bump tops are formed using the reflow method, it is necessary to prepare a support matrix which mechanically supports the base contact bumps to stabilize their shape by means of the hardened matrix material.

SUMMARY OF THE INVENTION

The object of the present invention is to propose a method for producing a substrate arrangement of the type specified initially which allows simplified production of the substrate arrangement.

In the method according to the invention the joining material is applied as joining material moldings and the contact bump tops are formed by at least partial melting of the joining material moldings by application of laser energy.

Compared with the known method, the method according to the invention thus has the advantage that as a result of the melting of the joining material moldings using laser energy, locally delimited, exactlydefinable thermal energy can be produced in the joining material moldings so that the melting of the joining material moldings to form the contact bump tops does not necessarily involve any melting of the base contact bumps. Thus, a support matrix to ensure that the base contact bumps retain their shape during the formation of the contact bump tops can be dispensed with. Consequently, there is no need for any removal of material to form contact surfaces between the base contact bumps and the contact bump tops.

In the event that contact between the chip arrangement produced according to the invention and a substrate should be made in a reflow method, according to one variant of the method it is possible to apply matrix material to receive the base contact bumps in an embedding fashion following the formation of the base contact bumps and preceding the formation of the contact bump tops.

If the matrix material has flux properties, i.e., for example, is constructed as a polymer flux material, the base contact bumps can be covered by the matrix material and before application of the joining material moldings to the base contact bumps or during the formation of the contact bump tops, the matrix material can be activated in the contact region on the base contact bumps by exposure to laser energy. In this connection, it is found to be especially advantageous if the matrix material in the contact regions and the joining material moldings are more or less simultaneously exposed to produce the structural join between the contact bump tops and the base contact bumps.

Following the formation of the contact bump tops, it is also possible to apply a matrix material to receive the base contact bumps and the contact bump tops in an embedding fashion in order to keep the associated reduction in the height of the contact bump structure as small as possible during the subsequent contacting of the chip arrangement with a substrate in the reflow method.

If following the formation of the base contact bumps and preceding the formation of contact bump tops, a matrix material to receive the base contact bumps in an embedding fashion is applied such that the base contact bumps are covered by the matrix material, it is found to be advantageous to ablate the matrix material arranged in a contact region on the base contact bumps by exposing it to laser energy before applying the joining material moldings to the base contact bumps. Even if the to material matrix comprises a hardened artificial resin structure, it is thus possible to dispense with the removal of material from a large area, unlike the method known from DE 197 54 372 A1, and ablate the matrix material merely in the actual contact regions. In this case, it is possible to use exactly the same laser device as is used for the subsequent melting of the joining material moldings to form the contact bump tops.

Especially if the matrix material has flux properties, any removal of the matrix material covering the base contact bumps can be dispensed with and rather, by applying the joining material moldings to the base contact bumps, the matrix material can be displaced in the contact regions on the base contact bumps. If necessary, this displacement can be preceded by liquefaction of the matrix material in the contact regions on the base contact bumps.

It can also be advantageous if the joining material moldings are applied to the base contact bumps covered by the matrix material, the matrix material is locally liquefied in the region of the base contact bumps by laser action and on application of the joining material moldings to the base contact bumps, the matrix material is displaced in contact regions with the joining material moldings.

If the matrix material is transferred to the solid state after displacement of the matrix material in contact regions with the joining material moldings, it is possible to merely selectively harden the matrix material and remove excess, still liquid, matrix material, by a flushing process for example.

Especially if the matrix material is polymer-based, for example, as polymer flux, the matrix material can be transferred to the solid state by polymerization.

Polymerization can be achieved, for example, by local action of laser energy on the matrix material in the peripheral region of the contact bump tops.

Especially in this connection, it is found to be particularly advantageous if a material provided with additives to reduce oxides at least on its surface is used as matrix material.

Preferred variants of the method for producing a chip arrangement are described in detail in the following with reference to the drawings. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
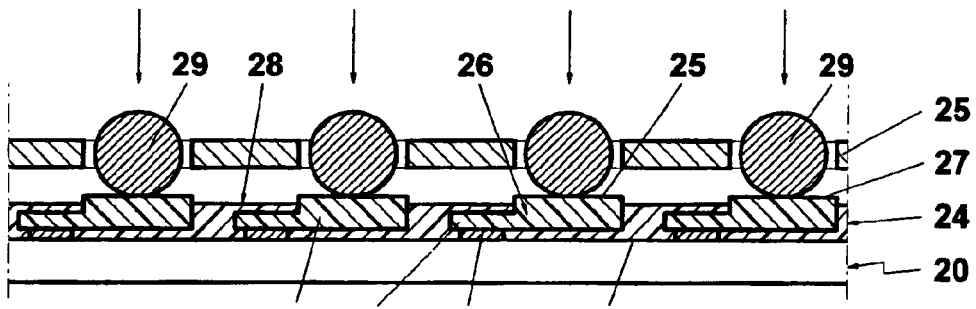
FIG. 1 is a sectional view showing the application of solder material moldings to form base contact bumps on connecting surfaces of a wiring layer arranged on a chip.

Referring to the drawings in particular, FIG. 1 shows a semiconductor substrate constructed as a chip 20 provided with chip connecting surfaces 22 on a contact surface 21. The chip connecting surfaces 22 are contacted by inner contacts 23 of a wiring layer 24 which are connected to outer contacts 27 via a conducting path structure 26 of the wiring layer 24. The outer contacts 27 have a distribution in an outer contact surface 28 of the wiring layer 24 which differs from the inner contacts 23 or the chip connecting surfaces 22.

Figure 2:
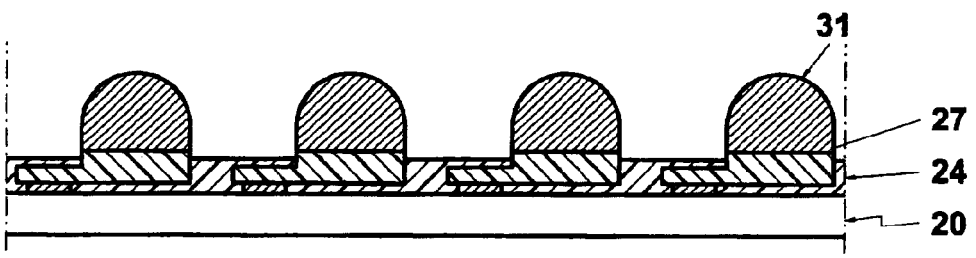
FIG. 2 is a sectional view showing the base contact bumps formed on the connecting surfaces.
Figure 3:
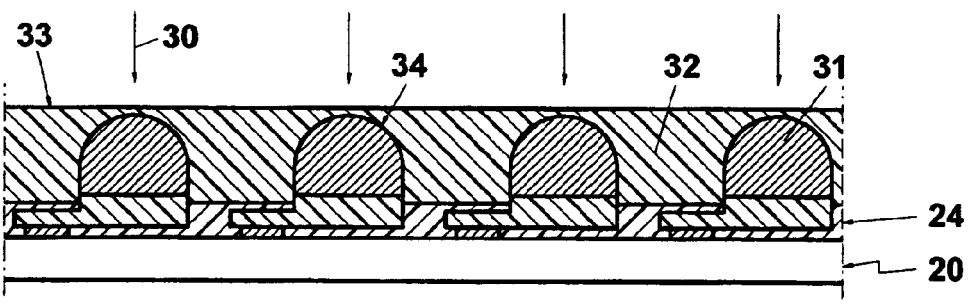
FIG. 3 is a sectional view showing the base contact bumps embedded in a matrix material on the wiring layer.
Figure 4:
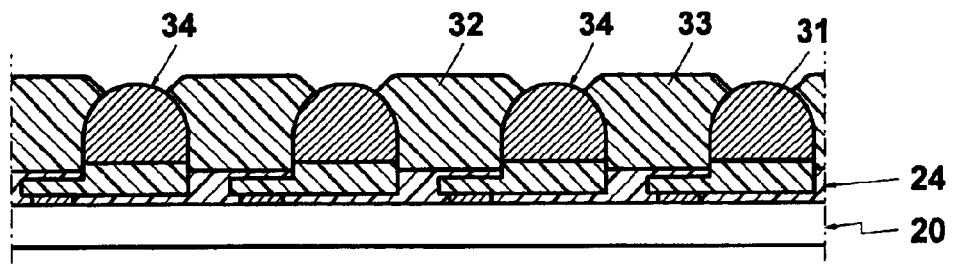
FIG. 4 is a sectional view showing the base contact bumps embedded in matrix material and exposed from matrix material in a contact region.
Figure 5:
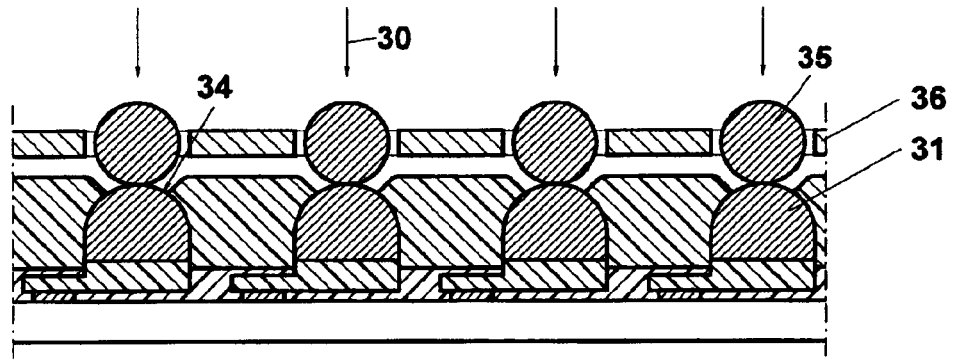
FIG. 5 is a sectional view showing the application of joining material moldings to the contact region of the base contact bumps.
Figure 6:
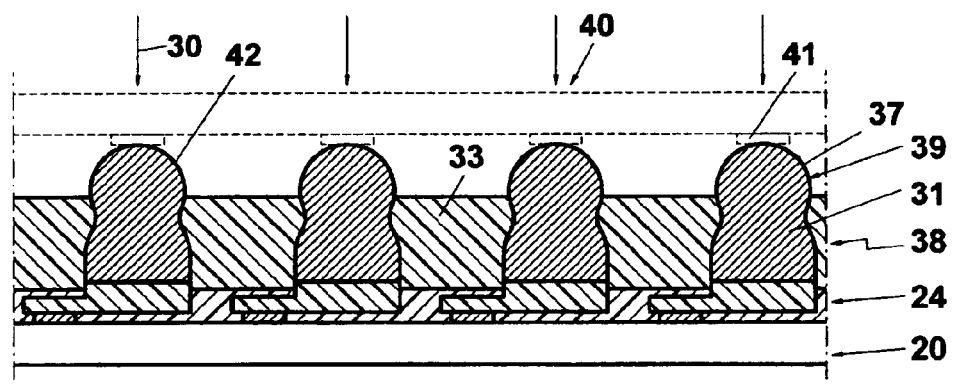
FIG. 6 is a sectional view showing the base contact bumps provided with contact bump tops.

FIG. 1 shows how, starting from the chip 20 in contact with the wiring layer 24, joining material moldings 29 constructed as spherical in the present case, are applied by means of a template 25 in an arrangement corresponding to the arrangement of the outer contacts 27 of the wiring layer 24. The joining material moldings 29 are then exposed to laser energy 30 using a laser device, not shown in detail here, in order to melt the joining material moldings 29 formed of solder material, for example, to wet the outer contacts 27 of the wiring layer 24 and form base contact bumps 31 as shown in FIG. 2. Following the formation of the base contact bumps 31, as shown in FIG. 3, a matrix material 32 in liquid form is applied to the wiring layer 24 to embed the base contact bumps 31 with a covering cladding. As shown further in FIG. 3, after hardening the matrix material 32 formed of an artificial resin base, for example, to form a support matrix 33 stabilizing the external shape of the base contact bumps 31, the matrix material 32 is exposed to laser energy 30 in the contact regions 34 on the base 25 contact bumps 31 to ablate the matrix material 32 in the contact regions 34, as shown in FIG. 4. After the contact regions 34 on the base contact bumps 31 have been exposed, joining material moldings 35 are applied to the base contact bumps 31 in the contact regions 34, as shown in FIG. 5. By analogy with the application of the joining material moldings 29 to the outer contacts 27 of the wiring layer 24, a defined arrangement of the joining material moldings 35 on the base contact bumps 31 is achieved by means of a template 25. As then shown in FIG. 5, the joining material moldings 35 applied to the base contact bumps 31 are then exposed to laser energy 30 in order to melt the joining material moldings 35 and wet the base contact bumps 31 in the contact regions 34 to form contact bump tops 37 on the base contact bumps 31 as shown in FIG. 6 so that an overall chip arrangement 38 is formed, comprising the chip 20 and the wiring layer 24 with raised contact bumps 39. In this case, it is found to be advantageous if the joining material to form the base contact bumps 31 has a higher melting point than the joining material forming the contact bump tops 37.

For example, possible joining materials for the joining material moldings 29, 35 may be conventional solder material, metal, especially higher-melting metal with a solder material coating or a polymer material with a solder material coating.

As shown in FIG. 6 by a contact substrate 40 shown as a dashed line, following the completion of the chip arrangement 38, the contact bumps 39 can be brought in contact with the connecting surfaces 41 of the contact substrate 40. This contacting can be accomplished by wetting the at least partly melted contact bumps 39 in a conventional fashion using the reflow method. Especially in the case of a transparent contact substrate 40, it is also possible to achieve partial melting of the contact bumps 39 which can be metered exactly in a contact region 42 with the connecting surfaces 41 by rearward exposure of the connecting surfaces 41 of the contact substrate 40 to laser energy 30, as indicated in FIG. 6.

Figure 7:
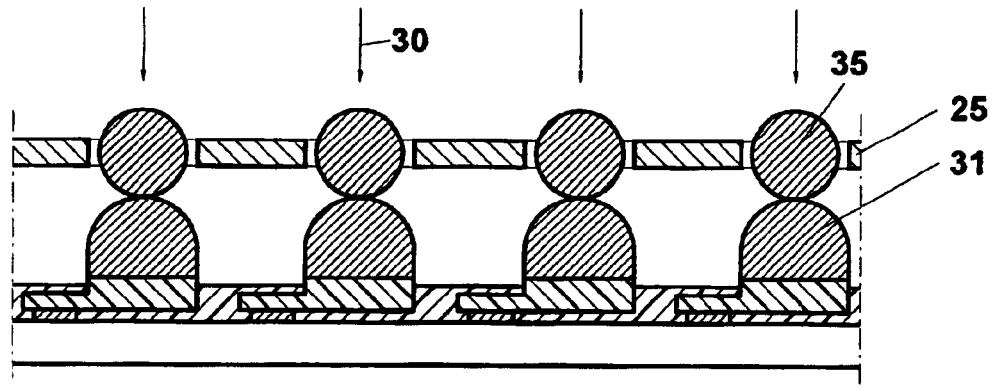
FIG. 7 is a sectional view showing the application of joining material moldings to exposed base contact bumps.

FIG. 7 shows a variant of the method wherein the application of a support matrix 33 to the wiring layer 24 is dispensed with and starting from the state of the method shown in FIG. 2, characterized by the exposed arrangement of the base contact bumps 31 on the outer contacts 25 of the wiring layer 24, the joining material moldings 35 are applied to the base contact bumps 31 by means of the template 25.

Figure 8:
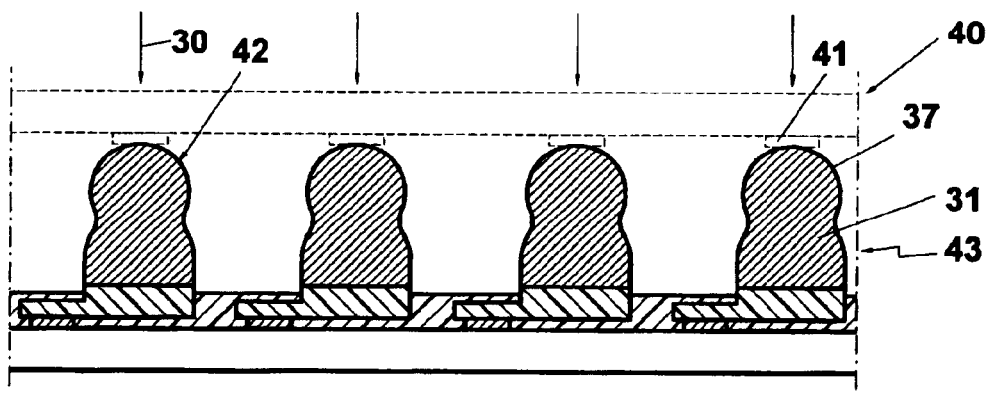
FIG. 8 is a sectional view showing the base contact bumps provided with contact bump tops.

Following the application of the joining material moldings 35 to the base contact bumps 31, the joining material moldings 35 are exposed to laser energy 30 to melt the joining material moldings 35 with wetting of the base contact bumps 31 and forming of contact bump tops 37 as shown in FIG. 8.

As also shown in FIG. 8, a chip arrangement 43 as shown in FIG. 6, which has no support matrix 33 unlike the chip arrangement 38 shown in FIG. 6, is subsequently brought in contact with a contact substrate 40 such that connecting surfaces 41 of the contact substrate 40 are rearwardly exposed to laser energy 30 through the transparent contact substrate 40 in order to merely locally melt the contact bump tops 37 in the immediate contact region 42 with the connecting surfaces 41 and produce contacting wetting of the contact bump tops 37 on the connecting surfaces 41 in the contact region 42.

Figure 9:
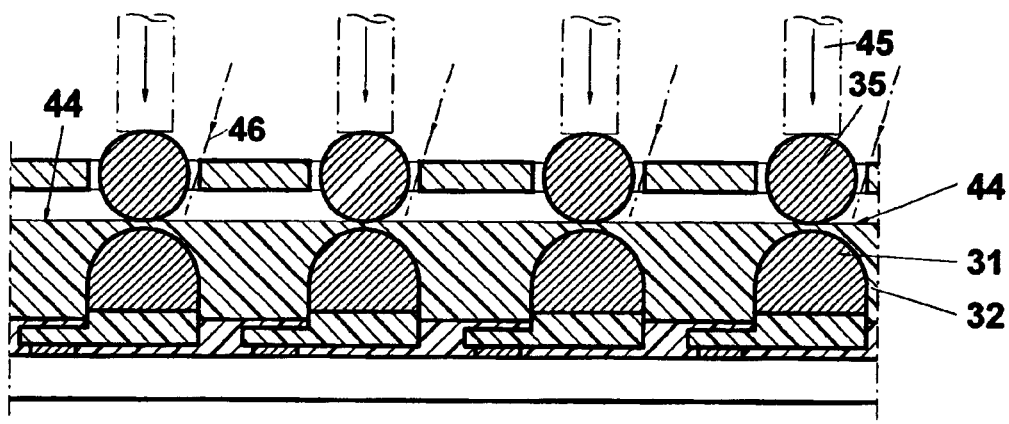
FIG. 9 is a sectional view showing the application of joining material moldings to base contact bumps covered by matrix material.

Another variant of the method is shown in FIGS. 9, 10,11 and 12 wherein the joining material moldings 35 are applied starting from the state of the process shown in FIG. 3 wherein the base contact bumps 31 formed on the connecting surfaces 27 of the wiring layer 24 are covered with matrix material 32. Starting from the base contact bumps 31 thus completely embedded in the support matrix 33 as shown in FIG. 9, the joining material moldings 35 are applied to a matrix surface 44 above contact regions of the base contact bumps 31. This is then advantageously followed by application of pressure to the joining material moldings 35 generated by an optical fiber 45 preceded by, or at 30 the same time as, exposure of the matrix surface 44 to laser energy 30 in the contact region 46 of the joining material moldings 35 with the matrix material 32 to liquefy the matrix material 32. Alternatively or additionally, laser energy can be applied through the optical fiber 45.

Figure 10:
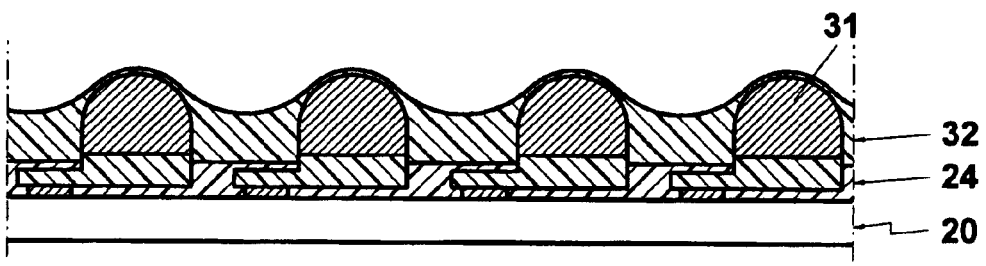
FIG. 10 is a sectional view showing base contact bumps covered by a matrix material film.

Instead of the large volume of matrix material 32 compared relative to the height of the base contact bumps 31 as in FIG. 9, it is also possible to make the volume of the matrix material 32 such that only the upper sides of the base contact bumps 31 are wetted as shown in FIG. 10.

Figure 11:
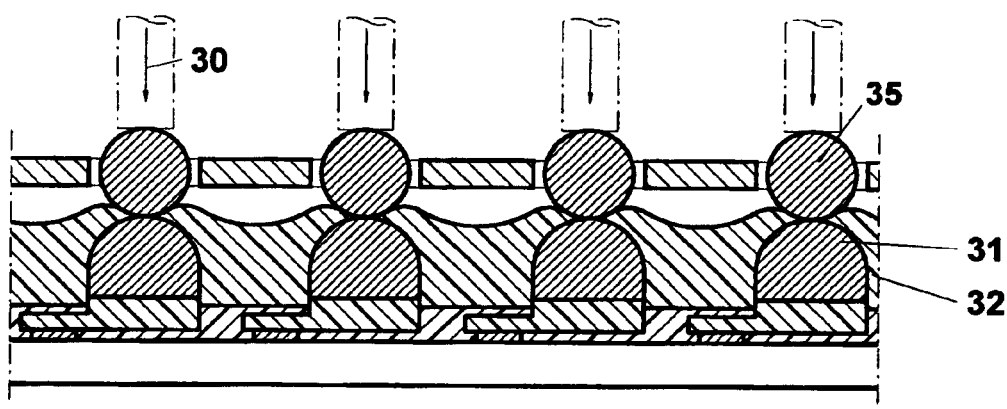
FIG. 11 is a sectional view showing the contacting of base contact bumps by joining material moldings to form contact bump tops with simultaneous liquefaction of the matrix material in the contact region.
Figure 12:
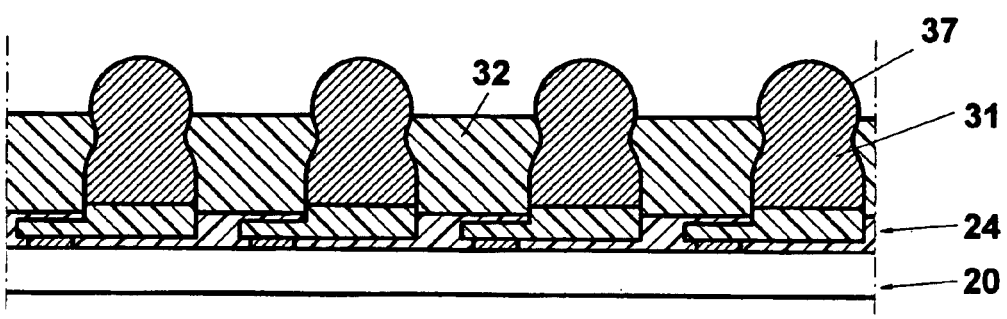
FIG. 12 is a sectional view showing the base contact bumps provided with contact bump tops.

As shown in FIG. 11, as a result of the application of pressure to the joining material moldings 35 by means of the optical fibers 45, matrix material 32 liquefied in the contact region 46 is displaced to produce a body contact between the joining material moldings 35 and the base contact bumps 31. If the matrix material 32 has flux properties, laser energy 30 can be applied to the joining material moldings 35 through the optical fibers 45 to melt the joining material moldings 35 with wetting of the base contact bumps 31 and forming of contact bump tops 37 as shown in FIG. 12.

While specific embodiments of the invention have been shown and described in detail to illustrate the application of the principles of the invention, it will be understood that the invention may be embodied otherwise without departing from such principles.

What is claimed is:

1. A method for producing a substrate arrangement the method comprising the steps of:
   preparing a substrate;
   bringing connecting surfaces of the substrate into contact with inner contacts of a wiring layer;
   applying contact material to outer contacts of the wiring layer defining an outer connecting surface arrangement to form base contact bumps;
   applying preformed joining material to the base contact bumps to form raised contact bump tops joined to the base contact bumps;
   applying the joining material as joining material moldings; and
   subsequently forming the contact bump tops by at least partial melting of the joining material moldings by application of laser energy.

2. The method according to claim 1, wherein following the formation of the base contact bumps and preceding the formation of the contact bump tops, a matrix material receiving the base contact bumps in an embedding fashion is applied.

3. The method according to claim 2, wherein the base contact bumps are covered by the matrix material and before the joining material moldings are applied to the base contact bumps or during the formation of the contact bump tops, the matrix material arranged in a contact region with the joining material moldings is exposed to laser energy.

4. The method according to claim 2, wherein the base contact bumps are covered by the matrix material and before the joining material moldings are applied to the base contact bumps, the matrix material arranged in a contact region on the base contact bumps is ablated by exposure to laser energy.

5. The method according to claim 2, wherein the base contact bumps are covered by the matrix material and during application of the joining material moldings to the base contact bumps, the matrix material is displaced in contact regions with the joining material moldings.

6. The method according to claim 5, wherein after displacement of the matrix material in contact regions with the joining material moldings the matrix material is transferred to the solid state.

7. The method according to claim 6, wherein the matrix material is transferred to the solid state by polymerization.

8. The method according to claim 7, wherein the polymerization takes place as a result of local action of laser energy on the matrix material in the peripheral region of the contact bump tops.

9. The method according to claim 7, wherein a material provided with additives for the reduction of oxides, at least on its surface, is used as matrix material.

10. The method according to claim 2, wherein the joining material moldings are applied to the base contact bumps covered by matrix material, a local liquefaction of the matrix material takes place in the region of the base contact bumps as a result of laser action and during application of the joining material moldings to the base contact bumps, the matrix material is displaced in the contact regions with the joining material moldings.

11. The method according to claim 1, wherein following the formation of the contact bump tops a matrix material receiving the base contact bumps and the contact bump tops in an embedding fashion is applied.

12. A method for producing a substrate arrangement, the method comprising the steps of:
   providing a substrate with a plurality of chip connecting surfaces on a contact surface of said substrate;
   providing a wiring layer with a plurality of vertical conducting path structures, each conducting path structure having a bottom inner contact and a top outer contact, wherein at least one said inner contact adjoins at least one said chip connecting surface;
   providing a template with a plurality of joining material molding over said wiring layer, wherein at least one of said plurality of joining material moldings adjoins at least one of said plurality of outer contacts;

melting said plurality of joining material molding by a laser device to form a plurality of base contact bumps; and providing a second plurality of joining material molding to said base contact bumps to form a plurality of raised contact bumps.

13. The method for producing a substrate arrangement according to claim 12, the method comprising the steps of:

applying a fluid matrix material to said wiring layer to embed said base contact bumps with a covering cladding following the formation of said base contact bumps;

hardening said matrix material; and a heating means to expose the top of said base contact bumps.

14. The method for producing a substrate arrangement according to claim 13, the method comprising the steps of:

displacing said matrix material in contact region with said joining material molding;

transferring said matrix material to the solid state by polymerization.

15. The method for producing a substrate arrangement according to claim 13, wherein a material provided with additives for the reduction of oxides, at least on its surface, is used as said matrix material.

16. A method for producing a substrate arrangement the method comprising the steps of:

preparing a substrate;

bringing connecting surfaces of the substrate into contact with inner contacts of a wiring layer;

applying contact material to outer contacts of the wiring layer defining an outer connecting surface arrangement to form base contact bumps;

applying a matrix material receiving the base contact bumps in an embedding fashion;

covering said base contact bumps by said matrix material;

applying joining material to the base contact bumps to form contact bump tops joined to the base contact bumps;

displacing said matrix material in contact region with said joining material molding;

transferring said matrix material to the solid state by polymerization;

applying the joining material as joining material moldings;

forming the contact bump tops by at least partial melting of the joining material moldings by application of laser energy, wherein a material provided with additives for the reduction of oxides, at least on its surface, is used as matrix material.

* * * * *